(12) United States Patent
Bae et al.

(10) Patent No.: US 7,879,662 B2
(45) Date of Patent: Feb. 1, 2011

(54) THIN FILM TRANSISTOR, THIN FILM TRANSISTOR SUBSTRATE INCLUDING THE SAME AND METHOD OF MANUFACTURING THE SAME

(75) Inventors: Yang-Ho Bae, Seoul (KR); Chang-Oh Jeong, Suwon-si (KR); Byeong-Beom Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/573,385

(22) Filed: Oct. 5, 2009

(65) Prior Publication Data

US 2010/0022055 A1    Jan. 28, 2010

Related U.S. Application Data

(62) Division of application No. 11/932,314, filed on Oct. 31, 2007, now Pat. No. 7,719,010.

(30) Foreign Application Priority Data

Nov. 24, 2006    (KR) ...................... 10-2006-0116987

(51) Int. Cl.
*H01L 21/00* (2006.01)

(52) U.S. Cl. ................................ 438/158; 257/E21.414

(58) Field of Classification Search .................. 257/59, 257/72, E21.414; 438/158
See application file for complete search history.

(56) References Cited

U.S. PATENT DOCUMENTS 7,649,582 B2 *    1/2010   Kim et al. ...................... 349/43
7,733,453 B2 *    6/2010   Ahn ............................. 349/141

* cited by examiner

*Primary Examiner*—Minh-Loan T Tran
(74) *Attorney, Agent, or Firm*—F. Chau & Associates, LLC

(57) ABSTRACT

A thin film transistor showing desirable contact characteristics during contact with indium tin oxide (ITO) or indium zinc oxide (IZO), in which a first conductive pattern including a gate electrode and a second conductive pattern including a source electrode and a drain electrode are formed without an etching process, a TFT substrate including the TFTs, and a method of manufacturing the same. The thin film transistor includes a gate electrode formed of a first conductive layer, a gate insulating layer covering the gate electrode, a semiconductor layer forming a channel on the gate insulating layer; an ohmic contact layer formed on the semiconductor layer, and a source electrode and a drain electrode formed of a second conductive layer and of a third conductive layer. The second conductive layer includes an aluminum-nickel alloy and nitrogen and is formed on the semiconductor layer. The third conductive layer includes an aluminum-nickel alloy and is formed on the second conductive layer.

8 Claims, 16 Drawing Sheets

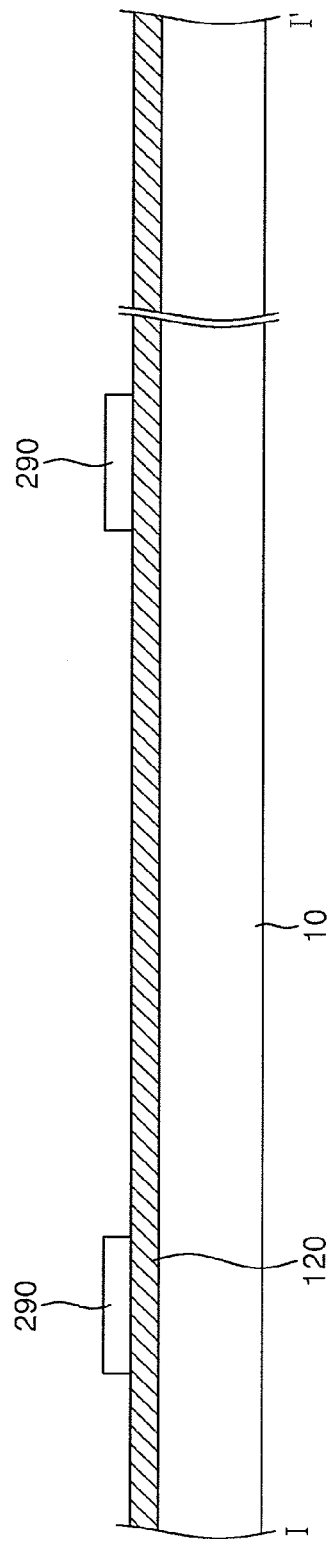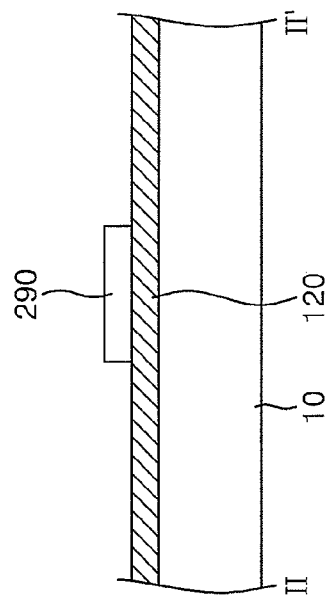

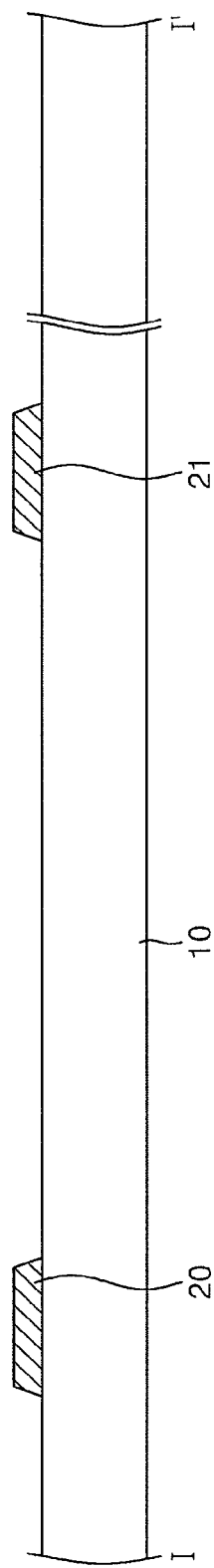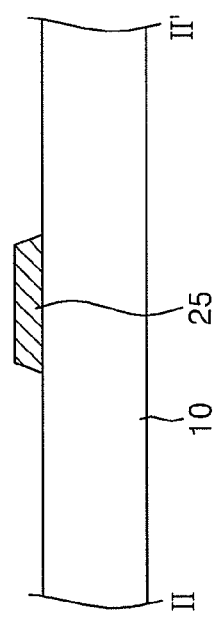

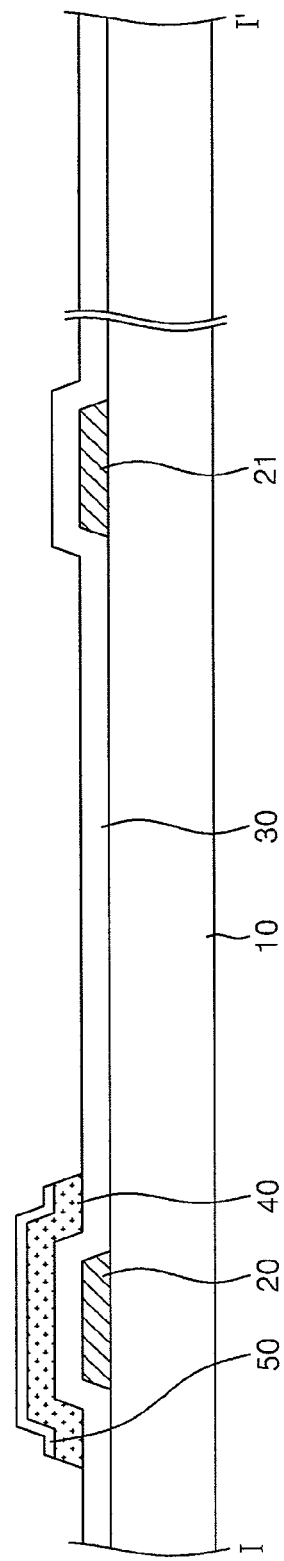
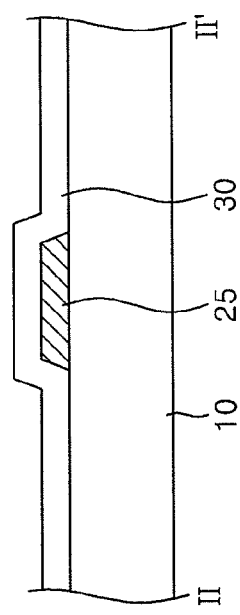
FIG.8A
FIG.8B

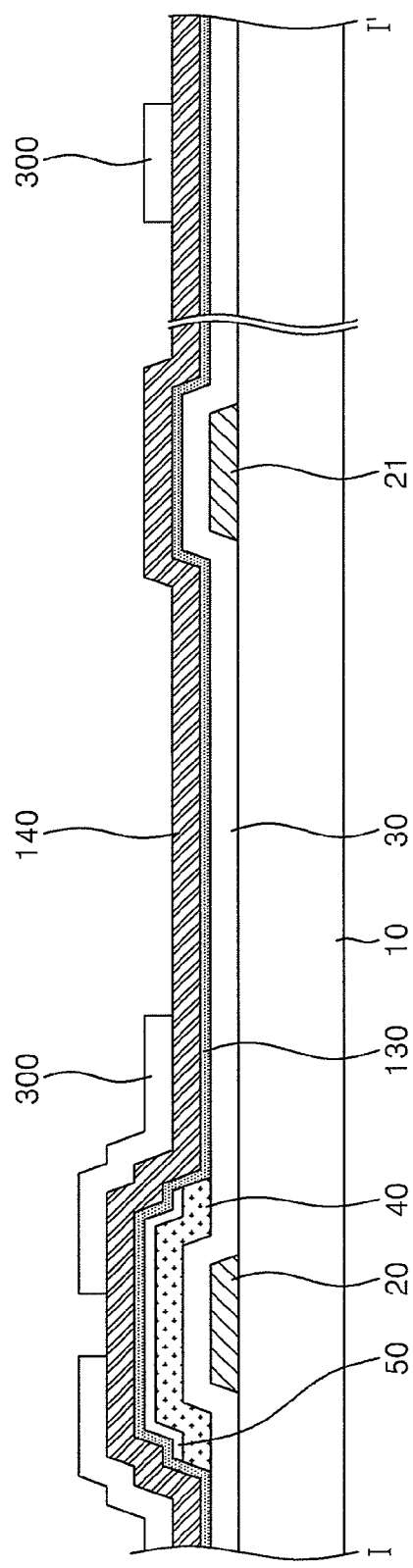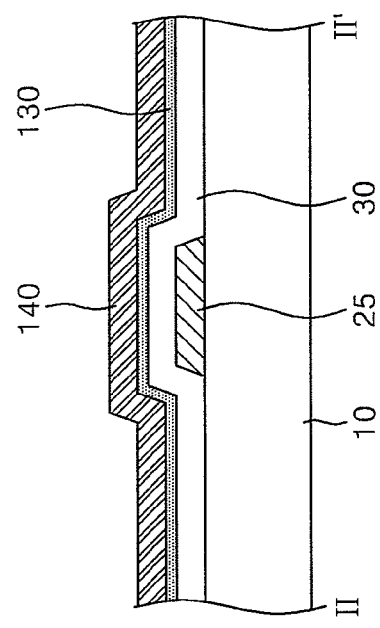

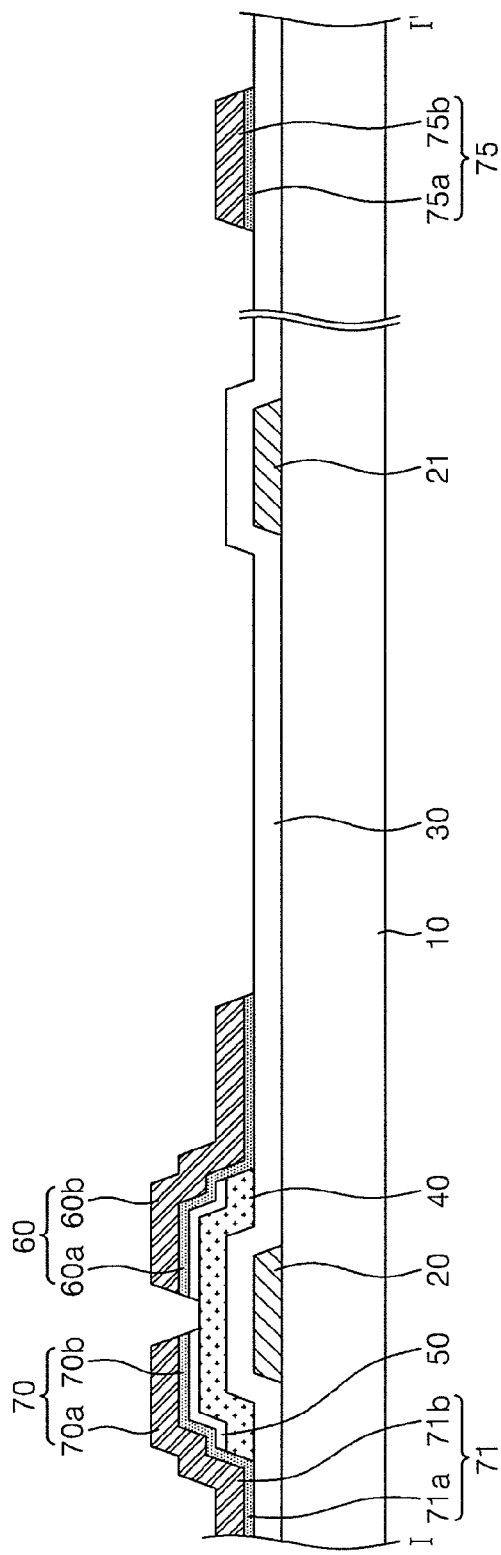
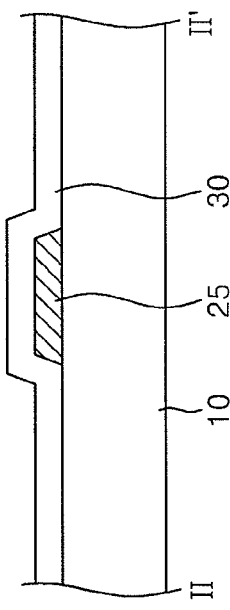
FIG.10C
FIG.10D

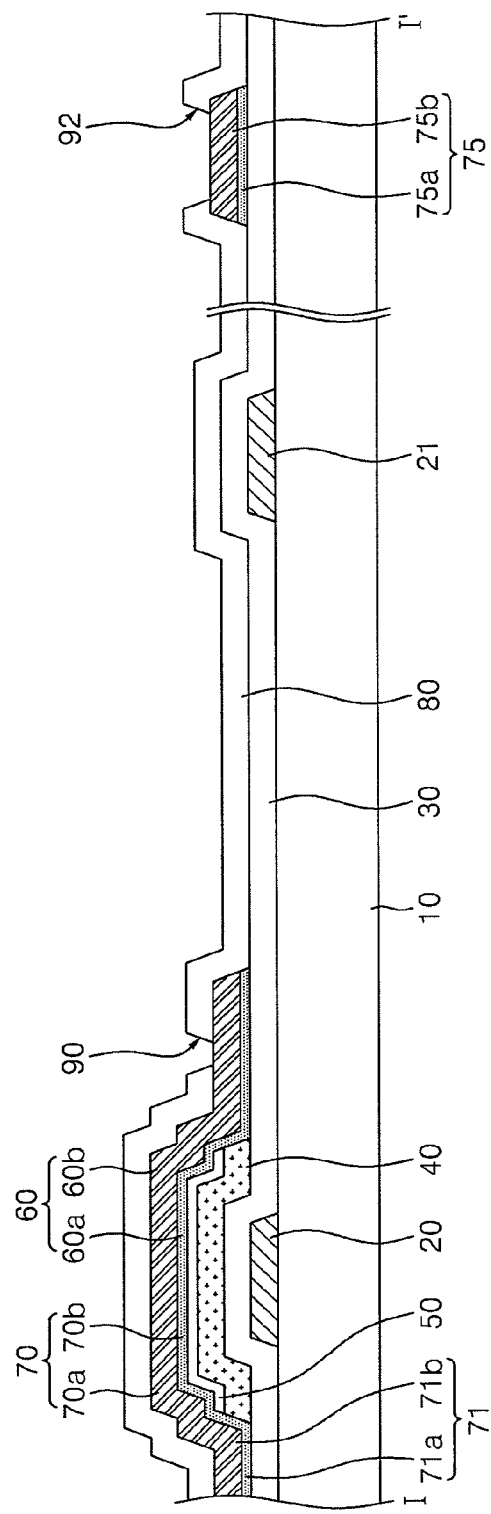
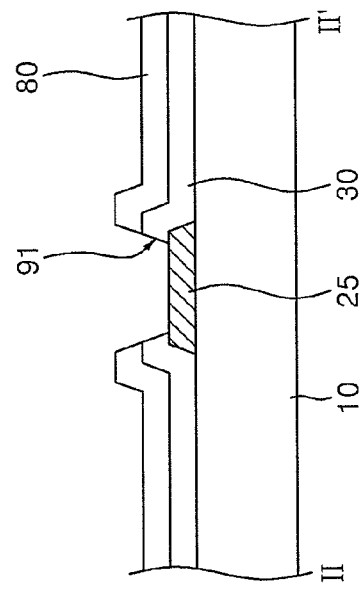
FIG.12A
FIG.12B

THIN FILM TRANSISTOR, THIN FILM TRANSISTOR SUBSTRATE INCLUDING THE SAME AND METHOD OF MANUFACTURING THE SAME

CROSS-REFERENCE TO RELATED APPLICATION

This application is a Divisional Application of U.S. patent application Ser. No. 11/932,314 filed on Oct. 31, 2007 now U.S. Pat. No. 7,719,010, which claims priority to Korean Patent Application No. 10-2006-0116987, filed on Nov. 24, 2006, the disclosures of which are incorporated herein by reference in their entireties.

BACKGROUND OF THE INVENTION

1. Technical Field

The present invention relates to a thin film transistor ("TFT") substrate and a method of manufacturing the same and, more particularly, to a TFT that can directly contact indium tin oxide ("ITO") or indium zinc oxide ("IZO") and has desirable voltage-current characteristics, a TFT substrate including the TFTs, and a method of manufacturing the same.

2. Discussion of the Related Art

A TFT substrate is used as a circuit substrate for driving respective pixels in a flat panel display device such as a liquid crystal display ("LCD") device, an organic light emitting diode ("OLED") display device, and the like. The TFT substrate includes a TFT arranged in each pixel area, and a pixel electrode connected to the TFT.

The gate lines and data lines carry signals to drive the TFTs using a voltage applied from an external driving circuit. Ends of the gate lines and data lines are exposed to be coupled to a driving circuit and then connected to a separate contact electrode to protect the exposed portions. The contact electrodes are formed of a transparent conductive material such as ITO, IZO, etc. The gate lines and data lines should be formed of a material having low contact resistance for the purpose of the connection with the contact electrodes.

Accordingly, conventional gate and data lines are formed of an alloy containing aluminum (Al), or a single metal such as AlNd, Cr, Mo, Cu, etc., in a single or multi-layer structure. Since internal resistance is considered, the gate lines are formed in a multi-layer structure of Al/AlNd, AlNd/Mo, Al/AlNd/Cr (or Mo), etc., and the data lines are formed in the same structure as the gate lines or in a multi-layer structure of Al/Mo, Mo/Cr/Mo, etc. When the gate lines and data lines are formed in such a multi-layer structure, it is necessary to add a process of stacking metals and to further use etchants for etching respective metals in an etching process, thus increasing process and material costs.

Furthermore, when exposing the gate line and data line for the purpose of the connection with the contact electrodes, the metals on the lower part of an insulating layer are overetched according to different etching ratios of the stacked metals to cause a void, thus resulting in corrosion on the metals due to penetration of the etchants during the formation of the contact electrodes.

In addition, if a metal containing aluminum (Al) is used as source and drain electrodes between an ohmic contact layer and source/drain electrodes during the formation of the TFT, the Al component may be diffused into the ohmic contact layer due to high temperature generated during the formation of a protection layer and a pixel electrode in the subsequent process, thus deteriorating the TFT characteristics.

SUMMARY OF THE INVENTION

Embodiments of the present invention provide a thin film transistor ("TFT") showing desired contact characteristics when coming in contact with indium tin oxide (ITO) or indium zinc oxide (IZO), wherein a first conductive pattern including a gate electrode and a second conductive pattern including a source electrode and a drain electrode are formed without an etching process, a TFT substrate including the TFTs, and a method of manufacturing the same.

An exemplary embodiment of the invention provides a thin film transistor ("TFT"). The TFT includes a gate electrode formed of a first conductive layer; a gate insulating layer covering the gate electrode; a semiconductor layer forming a channel on the gate insulating layer; an ohmic contact layer formed on the semiconductor layer; and a source electrode and a drain electrode formed of a second conductive layer, which includes an aluminum-nickel alloy and nitrogen and is formed on the semiconductor layer, and of a third conductive layer, which includes an aluminum-nickel alloy and is formed on the second conductive layer.

The second conductive layer may be formed with a thickness of less than about 1000 Å, and the third conductive layer may be formed with a thickness of less than about 4500 Å.

Moreover, the first conductive layer may be formed in a single layer comprising an aluminum-nickel alloy.

Furthermore, the first to third conductive layers may comprise aluminum, 0.1 to 6 atm % of nickel, and a total of 0.1 to 2 atm % of at least one selected from the group consisting of magnesium (Mg), chromium (Cr), manganese (Mn), ruthenium (Ru), rhodium (Rh), palladium (Pd), iridium (Ir), platinum (Pt), lanthanum (La), cerium (Ce), praseodymium (Pr), gadolinium (Gd), terbium (Tb), samarium (Sm), europium (Eu), holmium (Ho), erbium (Er), thulium (Tm), ytterbium (Yb), lutetium (Lu), titanium (Ti), vanadium (V), zirconium (Zr), niobium (Nb), molybdenum (Mo), hafnium (Hf), tantalum (Ta), tungsten (W), and dysprosium (Dy).

In addition, the TFT may further comprise a nitride layer formed between the ohmic contact layer and the second conductive layer.

Another exemplary embodiment of the invention provides a thin film transistor ("TFT") substrate. The TFT substrate includes a TFT including a gate electrode formed of a first conductive layer on a substrate, a gate insulating layer covering the gate electrode, a semiconductor layer forming a channel on the gate insulating layer, an ohmic contact layer formed on the semiconductor layer, and a source electrode and a drain electrode formed of a second conductive layer, which includes an aluminum-nickel alloy and nitrogen and is formed on the semiconductor layer, and of a third conductive layer, which includes an aluminum-nickel alloy and is formed on the second conductive layer; a gate line connected to the gate electrode; a data line intersecting the gate line, insulated by the gate insulating layer, and including the source electrode; a protection layer including a pixel contact hole exposing the drain electrode and covering the thin film transistor; and a pixel electrode formed on the protection layer and connected to the drain electrode through the pixel contact hole.

The second conductive layer may be formed with a thickness of less than about 1000 Å, and the third conductive layer may be formed with a thickness of less than about 4500 Å.

Moreover, the first conductive layer may be formed of a metallic material including an aluminum-nickel alloy.

Furthermore, the TFT substrate may further comprise a gate contact pad formed of a first conductive layer on an end of the gate line; a data contact pad formed by stacking the second and third conductive layers on an end of the data line; first and second contact holes exposing the gate contact pad and the data contact pad, respectively; a first pad electrode connected to the gate line through the first contact hole; and a second pad electrode connected to the data line through the second contact hole.

In addition, the first and second contact pads may be formed of the same material as the pixel electrode on the same layer as the pixel electrode.

Additionally, the first to third conductive layers may comprise aluminum, 0.1 to 6 atm % of nickel, and a total of 0.1 to 2 atm % of at least one selected from the group consisting of magnesium (Mg), chromium (Cr), manganese (Mn), ruthenium (Ru), rhodium (Rh), palladium (Pd), iridium (Ir), platinum (Pt), lanthanum (La), cerium (Ce), praseodymium (Pr), gadolinium (Gd), terbium (Tb), samarium (Sm), europium (Eu), holmium (Ho), erbium (Er), thulium (Tm), ytterbium (Yb), lutetium (Lu), titanium (Ti), vanadium (V), zirconium (Zr), niobium (Nb), molybdenum (Mo), hafnium (Hf), tantalum (Ta), tungsten (W), and dysprosium (Dy).

Moreover, the TFT substrate may further comprise a nitride layer formed between the ohmic contact layer and the second conductive layer.

Another exemplary embodiment of the invention provides a method of manufacturing a thin film transistor ("TFT") substrate. The method includes forming a first conductive pattern group including a gate line and a gate electrode on a substrate as a first conductive layer; forming a gate insulating layer on the first conductive pattern group; forming a semiconductor layer and an ohmic contact layer on the gate insulating layer and overlapping the gate electrode; forming a second conductive pattern group including a source electrode, a drain electrode and a data line, wherein the source and drain electrodes are formed of a second conductive layer, which is formed on the ohmic contact layer and contains aluminum nitride and nickel nitride, and of a third conductive layer, which is formed on the second conductive layer and contains aluminum and nickel, and wherein the data line is connected to the source electrode, intersects the gate line and is insulated by the gate insulating layer; forming a protection layer on the gate insulating layer, on which the second conductive pattern group has been formed, wherein the protection layer includes a pixel contact hole exposing the drain electrode; and forming a third conductive pattern group on the protection layer, wherein the third conductive pattern group includes a pixel electrode connected to the drain electrode through the pixel contact hole.

Forming the second conductive pattern group may comprise forming the second conductive layer; forming the third conductive layer on the second conductive layer; forming a photoresist on the third conductive layer; exposing the photoresist; forming a second photoresist pattern by developing the exposed photoresist using a TMAH solution; and patterning the second and third conductive layers in the form of the second photoresist pattern through an etching process using the TMAH solution.

Moreover, forming the second conductive layer may further comprise supplying argon gas and nitrogen gas in a chamber.

Furthermore, in the supplying the argon and nitrogen gases, the argon and nitrogen gases may be mixed with each other in a ratio of from 1:0.25 to 1:4.

In addition, forming the second and third conductive layers may comprise forming the second conductive layer with a thickness of less than about 1000 Å; and forming the third conductive layer with a thickness of less than about 4500 Å.

Moreover, forming the first conductive pattern group may comprise forming a first conductive layer on the substrate; disposing a photoresist on the first conductive layer; exposing the photoresist; forming a first photoresist pattern by developing the exposed photoresist with the TMAH solution; and patterning the first conductive layer in the form of the first photoresist pattern through an etching process using the TMAH solution.

Furthermore, the method of manufacturing the TFT substrate may further comprise forming a gate contact pad formed of the first conductive layer and connected to the gate line; forming a data contact pad formed of the second and third conductive layers and connected to the data line; forming a first contact hole exposing the gate contact pad; forming a second contact hole exposing the data contact pad; forming a first pad electrode connected to the gate contact pad through the first contact hole; and forming a second pad electrode connected to the data contact pad through the second contact hole.

In addition, forming the first to third conductive layers may further comprise etching the first to third conductive layers at an etch rate of more than 100 nm/min for the TMAH solution.

Another exemplary embodiment of the present invention provides a thin film transistor ("TFT") substrate. The TFT substrate includes a substrate; a gate line formed on the substrate and including a gate electrode; a gate insulating layer covering the gate line; a semiconductor layer formed on the gate insulating layer; an ohmic contact layer formed on the semiconductor layer; a data line intersecting the gate line and including a source electrode; a drain electrode facing the source electrode; and a pixel electrode electrically connected to the drain electrode, the data line and the drain electrode being formed of a conductive layer containing aluminum and nickel, and nitrogen in which a nitrogen density of the lower portion of the conductive layer is higher than a nitrogen density of the upper portion of the conductive layer.

Moreover, the conductive layer may comprise aluminum, 0.1 to 6 atm % of nickel, and a total of 0.1 to 2 atm % of at least one selected from the group consisting of magnesium (Mg), chromium (Cr), manganese (Mn), ruthenium (Ru), rhodium (Rh), palladium (Pd), iridium (Ir), platinum (Pt), lanthanum (La), cerium (Ce), praseodymium (Pr), gadolinium (Gd), terbium (Tb), samarium (Sm), europium (Eu), holmium (Ho), erbium (Er), thulium (Tm), ytterbium (Yb), lutetium (Lu), titanium (Ti), vanadium (V), zirconium (Zr), niobium (Nb), molybdenum (Mo), hafnium (Hf), tantalum (Ta), tungsten (W), and dysprosium (Dy).

Furthermore, the ohmic contact layer may include nitrogen on the upper portion thereof and a nitrogen density of the upper portion is higher than a nitrogen density of the lower portion.

BRIEF DESCRIPTION OF THE DRAWINGS

Exemplary embodiments of the present disclosure can be understood in more detail from the following description taken in conjunction with the accompanying drawings, in which:

FIGS. 6A and 6C and FIGS. 6B and 6D are cross-sectional views taken along lines I-I' and II-II', respectively, of the TFT substrate in FIG. 5 for showing a method of manufacturing a TFT substrate according to an exemplary embodiment of the present invention;

FIGS. 8A and 8B are cross-sectional views taken along lines I-I' and II-II' of the TFT substrate in FIG. 7;

FIGS. 10A and 10C and 10B and 10D show cross-sectional views taken along lines I-I' and II-II', respectively, of the TFT substrate in FIG. 9 for showing a method of manufacturing a TFT substrate according to an exemplary embodiment of the present invention;

FIGS. 12A and 12B are cross-sectional views taken along lines I-I' and II-II' of the TFT substrate in FIG. 11;

DETAILED DESCRIPTION OF EXEMPLARY EMBODIMENTS

Exemplary embodiments of the present invention will now be described with reference to the attached drawings. This invention may, however, be embodied in many different forms and should not be construed as limited to the embodiments set forth herein.

Figure 1:
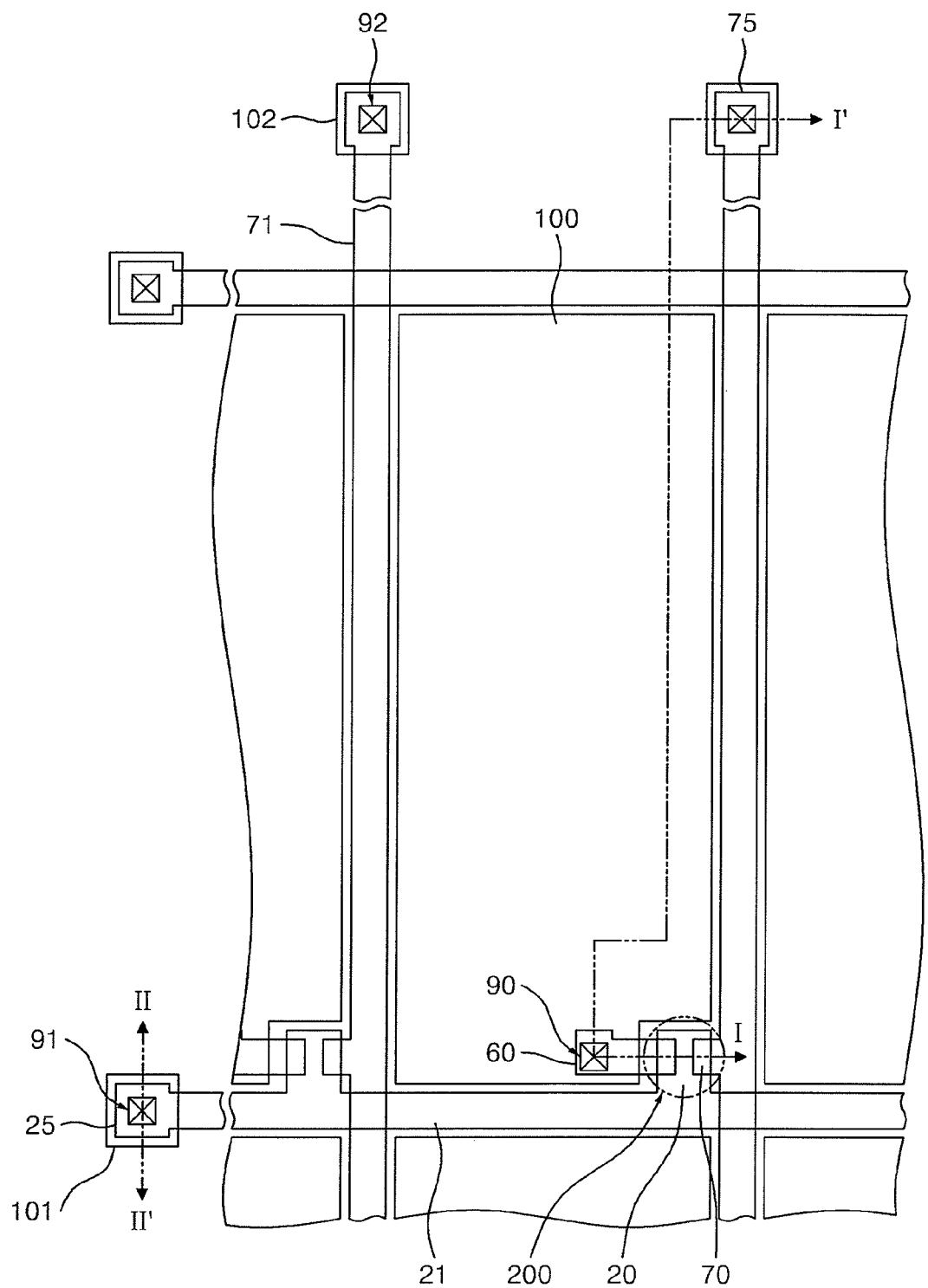
FIG. 1 is a plan view of a thin film transistor ("TFT") substrate according to an exemplary embodiment of the present invention.
Figure 2A:
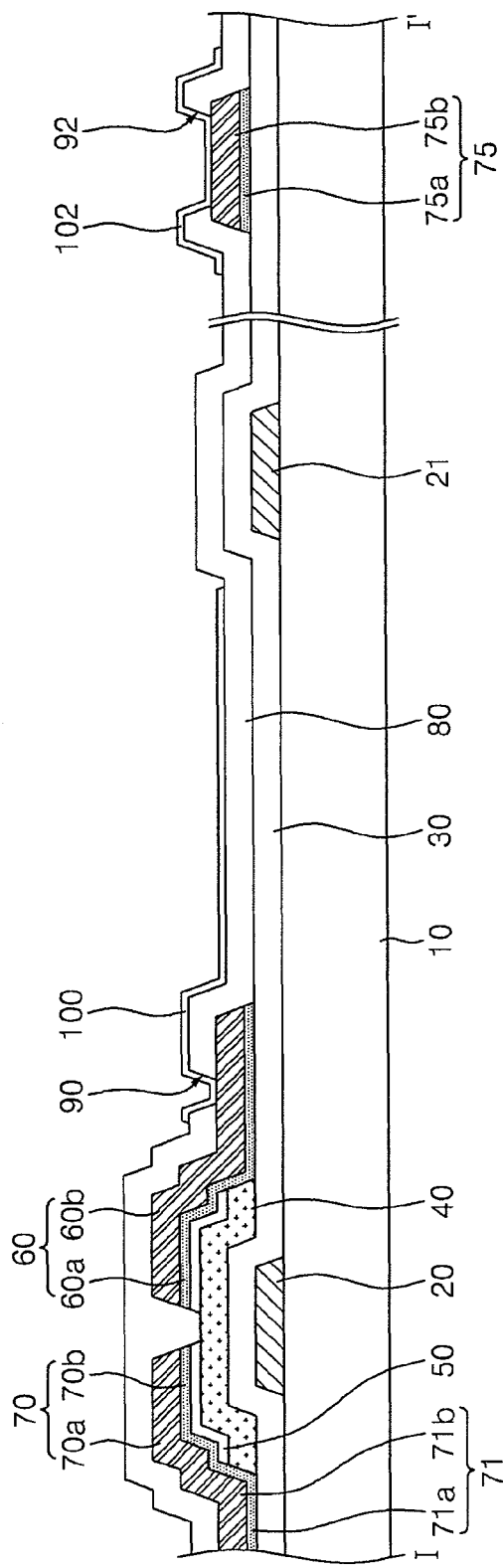
FIGS. 2A and 2B are cross-sectional views taken along lines I-I' and II-II' of the TFT substrate in FIG. 1.
Figure 2B:
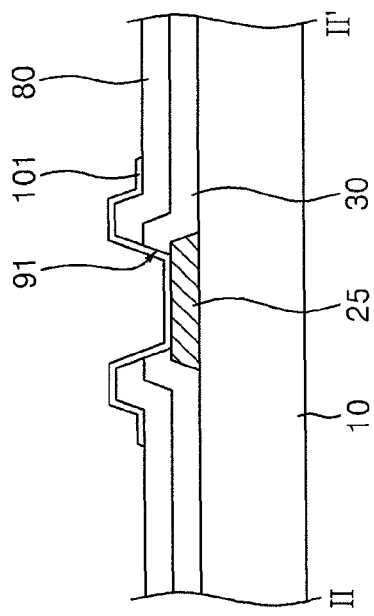

FIG. 1 is a plan view of a thin film transistor ("TFT") substrate according to an exemplary embodiment of the present invention and FIGS. 2A and 2B are cross-sectional views taken along lines I-I' and II-II' of the TFT substrate in FIG. 1.

Referring to FIGS. 1, 2A and 2B, a TFT substrate includes gate lines 21 and data lines 71 intersecting each other and insulated by a gate insulating layer 30 to form pixel areas on a substrate 10. A pixel area includes a pixel electrode 100 and a TFT 200. A gate contact pad 25 is formed on an end of the gate line 21 and connected to a gate driving unit, and a first pad electrode 101 is coupled to the gate contact pad 25. A data contact pad 75 is formed on an end of the data line 71 and connected to a data driving unit and a second pad electrode 102 is coupled to the data contact pad 75.

The gate line 21, a gate electrode 20 and the gate contact pad 25 are formed of a first conductive layer 120 containing aluminium (Al) and nickel (Ni) (see FIGS. 6A-6D). The data line 71, a source electrode 70, a drain electrode 60 and the data contact pad 75 are formed in a double layer structure in which a second conductive layer 130 having an aluminium (Al)-nickel (Ni) alloy and nitrogen (N) and a third conductive layer 140 containing Al and Ni are stacked (see FIGS. 10A-10D).

In more detail, an insulating substrate such as transparent glass, plastic, etc. is used as the substrate 10. The gate lines 21 and the data lines 71 are formed on the substrate 10.

The gate line 21 supplies a scan signal and the data line 71 supplies an image data signal. The gate lines 21 and the data lines 71 intersect each other and are insulated by a gate insulating layer 30. The gate contact pad 25 and the data contact pad 75 are respectively formed on the end of the gate line 21 and the data line 71 to be connected to a driving circuit (not shown).

The TFT 200 coupled to the gate line 21 and the data line 71 is formed in each pixel area. The pixel electrode 100 connected to the TFT 200 is formed in the pixel area. Moreover, the pixel area may further include a storage line (not shown) providing a storage voltage and arranged parallel to the gate line 21.

The TFT 200 includes the gate electrode 20 connected to the gate line 21, a source electrode 70 connected to the data line 71, a drain electrode 60 connected to the pixel electrode 100 and facing the source electrode 70, and a semiconductor layer 40 overlapping the gate electrode 20 and the gate insulating layer 30 and forming a channel between the source electrode 70 and the drain electrode 60. The TFT 200 may further include an ohmic contact layer 50 for forming ohmic contact between the source electrode 70, the drain electrode 60 and the semiconductor layer 40. The TFT 200 configured as described above supplies an image data signal of the data line 71 to the pixel electrode 100 in response to a scan signal received from the gate line 21.

The gate electrode 20, which is electrically connected to the gate line 21, turns on the TFT 200 using the scan signal received from the gate line 21.

The gate line 21, the gate electrode 20 and the gate contact pad 25 are formed of the first conductive layer 120 including Al and Ni. The gate contact pad 25 is formed of the first conductive layer 120, the same as the gate line 21, in preparation for contact with the first pad electrode 101.

The first conductive layer 120 formed of an AlNi alloy may further comprise at least one of magnesium (Mg), chromium (Cr), manganese (Mn), ruthenium (Ru), rhodium (Rh), palladium (Pd), iridium (Ir), platinum (Pt), lanthanum (La), cerium (Ce), praseodymium (Pr), gadolinium (Gd), terbium (Tb), samarium (Sm), europium (Eu), holmium (Ho), erbium (Er), thulium (Tm), ytterbium (Yb), lutetium (Lu), titanium (Ti), vanadium (V), zirconium (Zr), niobium (Nb), molybdenum (Mo), hafnium (Hf), tantalum (Ta), tungsten (W), and dysprosium (Dy). For example, the first conductive layer 120 may comprise an Al-based alloy containing 0.1 to 6 atm % of Ni and a total of 0.1 to 2 atm % of at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Nb, Mo, Hf, Ta, W and Dy.

The data line 71, the source electrode 70, the drain electrode 60 and the data contact pad 75 are formed in a multilayer structure in which the second conductive layer 130 including an AlNi alloy or an AlNi alloy containing added elements with nitrogen (N) and the third conductive layer 140 including an AlNi alloy or an AlNi alloy containing added elements are sequentially stacked. Since the data contact pad 75 is formed of a metal including AlNi, the data contact pad 75 can directly contact the second contact pad 102 formed of a transparent electrode such as ITO and the like and has low contact resistance.

Such second and third contact layers 130 and 140 formed of the AlNi alloy may further comprise at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Nb, Mo, Hf, Ta, W and Dy. In an exemplary embodiment, the second and third contact layers 130 and 140 may comprise an Al-based alloy containing 0.1 to 6 atm % of Ni and a total of 0.1 to 2 atm % of at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Nb, Mo, Hf, Ta, W and Dy.

The gate insulating layer 30 is formed on the substrate 10 to cover the upper portion of the gate line 21, the gate electrode 20 and the gate contact pad 25. The gate insulating layer 30 is formed of an inorganic insulating material such as silicon nitride (SiNx), silicon oxide (SiOx), etc.

The semiconductor layer 40 and the ohmic contact layer 50 are formed on the gate insulating layer 30 overlapping the gate electrode 20. The semiconductor layer 40 is formed of a semiconductor material such as amorphous silicon ("a-Si"), poly silicon ("p-Si"), etc. to form a channel of the TFT 200. The ohmic contact layer 50 is formed between the semiconductor layer 40 and the source electrode 70 and between the semiconductor layer 40 and the drain electrode 60. The ohmic contact layer 50 is formed of, for example, n+a-Si or n+p-Si, in which impurities are added to a-Si or p-Si.

The second conductive layer 130 is formed on the ohmic contact layer 50 and the third conductive layer 140 is formed on the second conductive layer 130. The second conductive layer 130 prevents the Al component from reacting to the ohmic contact layer 50 and penetrating the a-Si at high temperature during the formation of a protection layer 80 and a pixel electrode 100 in a subsequent process, thus preventing deterioration of the TFT 200 characteristics.

Figure 3:
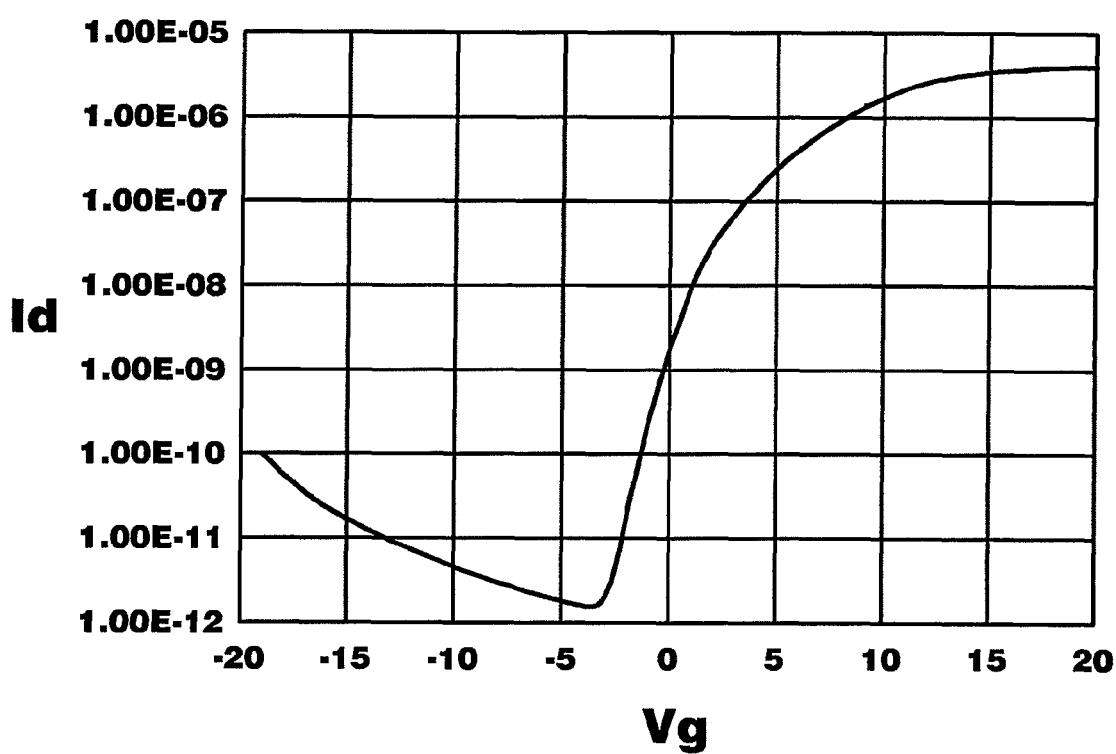
FIG. 3 is a graph showing voltage-current (V-I) characteristics of the TFT according to an exemplary embodiment of the present invention.

FIG. 3 is a graph showing voltage-current (V-I) characteristics of the TFT 200 measured after forming the source electrode 70 and the drain electrode 60 of the TFT 200 in a double layer structure of AlNiN and AlNi alloys. As shown in FIG. 3, the on-current and off-current characteristics at the drain electrode 60 when a gate-on voltage is provided to the TFT 200 and when a gate-off voltage is provided to the TFT 200 are favorable. According to an embodiment, a nitride layer can be formed between the ohmic contact layer 50 and the second conductive layer 130. That is, the nitride layer can be formed on the upper portion of the ohmic contact layer 50 by providing nitrogen when forming the second conductive layer 130. Accordingly, the Al component of the second conductive layer 130 is prevented from penetrating into the ohmic contact layer 50.

The third conductive layer 140 formed on the upper portion of the second conductive layer 130 has an improved contact characteristic since the contact resistance between the drain electrode 60 and the pixel electrode 100 is low.

The protection layer 80 is formed on the upper portion of the data line 71 and the TFT 200 to protect the data line 71 and the TFT 200. The protection layer 80 includes a pixel contact hole 90 exposing the drain electrode 60, a first contact hole 91 exposing the gate contact pad 25, and a second contact hole 92 exposing the data contact pad 75. The first contact hole 91 is formed by penetrating the gate insulating layer 30. The protection layer 80 may be formed of an inorganic insulating material such as SiNx, SiOx, etc., and can be the same material as the gate insulating layer 30, an organic insulating material or in a double layer structure.

If the organic material is used, the protection layer 80 may be formed with a height of several microns (μm) so that the pixel electrode 100 may overlap the gate line 21 and the data line 71. Accordingly, it is possible to increase an aperture ratio. If the organic protection layer 80 is formed between the source electrode 70 and the drain electrode 60 of the TFT 200, it may cause deterioration of the TFT 200 due to a reaction between the organic material and the semiconductor layer 40. In other words, the magnitude of the off-current between the source electrode 70 and the drain electrode 60 is increased when the gate-off voltage is applied to the TFT 200, thus deteriorating the turn-off characteristics of the TFT 200. Accordingly, an inorganic material is formed on the TFT 200, the data line 71 and the gate insulating layer 30 to prevent the deterioration of the TFT 200.

The pixel electrode 100 is formed on the protection layer 80 covering the TFT 200 and is connected to the drain electrode 60 through the pixel contact hole 90 penetrating the protection layer 80. The pixel electrode 100 drives liquid crystal using a voltage difference with a common electrode of a color filter substrate, when an image data signal is supplied from the TFT, to control light transmittance. The pixel electrode 100 may be formed of a transparent conductive material such as ITO, IZO, indium tin zinc oxide (ITZO), etc. If the protection layer 80 is formed of an organic material, it is possible to form the pixel electrode 100 to overlap the data line 71 positioned on the left and right sides of the pixel electrode 100 and to overlap the gate line 21 positioned on the top and bottom sides of the pixel electrode 100.

The first pad electrode 101 is connected to the gate contact pad 25 through the first contact hole 91, and the second pad electrode 102 is coupled to the data contact pad 75 through the second contact hole 92. The first and second contact pads 101 and 102 may be formed of a transparent conductive material such as ITO, IZO, ITZO, etc., the same material as the pixel electrode 100.

According to the exemplary embodiment of the present invention, it is possible to form the first to the third conductive layers 120 to 140 with an alloy including Al and Ni. It is further possible to add nitrogen to the first to the third conductive layers 120 to 140. Moreover, it is possible to set the nitrogen density of the lower portion of the first to the third conductive layers 120 to 140 higher than the nitrogen density of the upper portion of the first to third conductive layers 120 to 140 to prevent the Al component of the second conductive layer 130 from being transferred to the ohmic contact layer 50. Furthermore, the ohmic contact layer 50 may further include nitrogen on the upper portion thereof and it is possible to set the nitrogen density of the upper portion of the ohmic contact layer 50 higher than the nitrogen density of the lower portion of the ohmic contact layer 50 to prevent the Al component of the second conductive layer 130 from being transferred to the ohmic contact layer 50.

As described above, the TFT and the TFT substrate according to the exemplary embodiment of the present invention include a first conductive pattern group formed of a metallic material having AlNi to modify a conventional first conductive pattern group, which is formed in a double layer structure so as to connect the first conductive pattern group to the pad electrode, into a single layer, thereby reducing the material cost.

Moreover, according to an exemplary embodiment of the present invention, a second conductive pattern group is formed in a structure in which AlNiN and AlNi are stacked to prevent the Al component from being diffused to the ohmic contact layer 50.

FIGS. 5 to 14B are cross-sectional views showing a method of manufacturing the TFT substrate of an exemplary embodiment of the present invention in the sequential order of mask processes.

Figure 5:
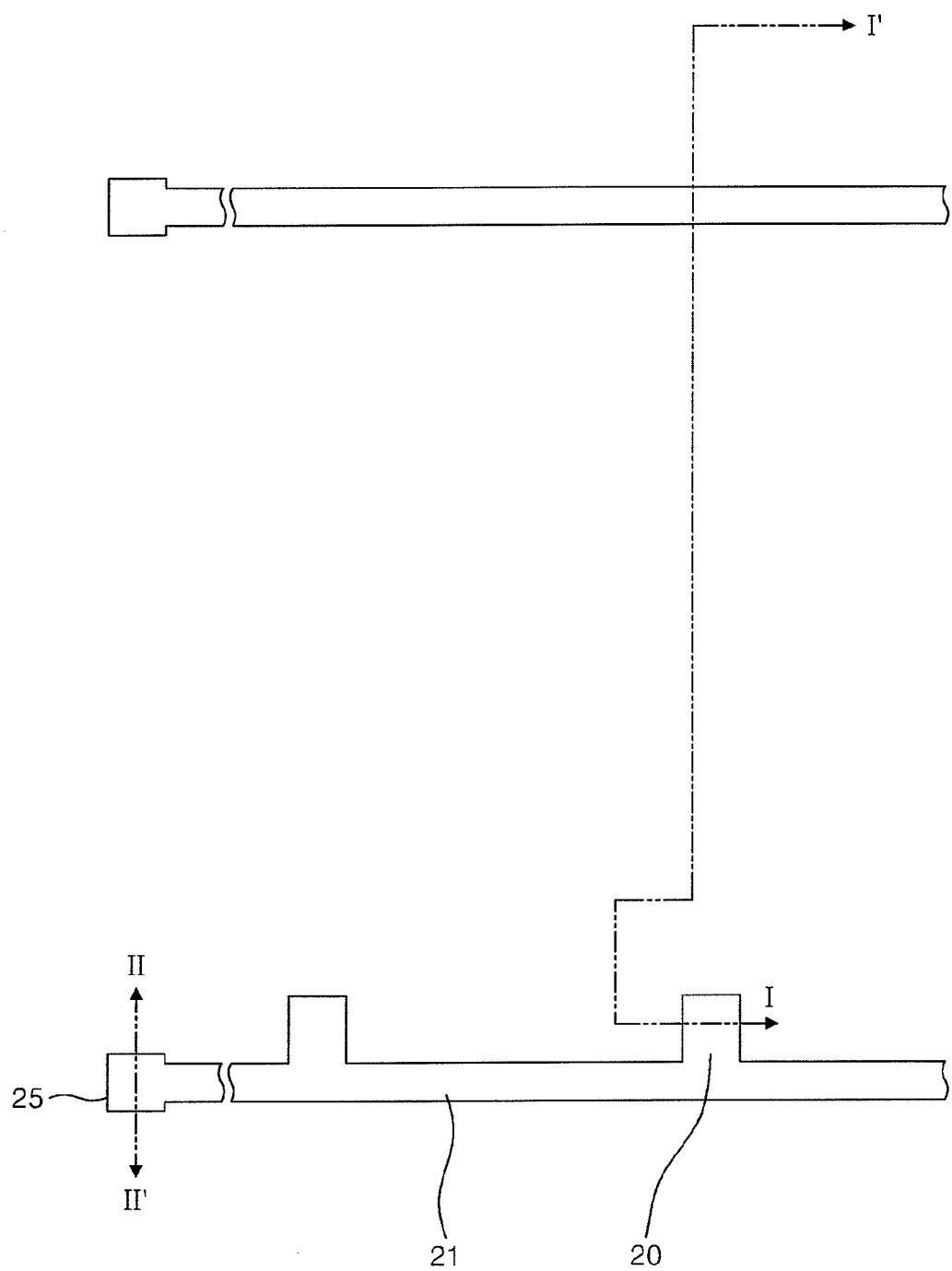
FIG. 5 is a plan view showing a first mask process in a method of manufacturing a TFT substrate according to an exemplary embodiment of the present invention.

FIG. 5 is a plan view showing a first mask process in the method of manufacturing a TFT substrate according to an exemplary embodiment of the present invention, and FIGS. 6A and 6C and 6B and 6D are cross-sectional views taken along lines I-I' and II-II', respectively, of the TFT substrate in FIG. 5.

Referring to FIGS. 5, 6A, 6B, 6C and 6D, a first conductive pattern group including the gate line 21, the gate electrode 20 and the gate contact pad 25 is formed on the substrate 10 through the first mask process.

In more detail, the first conductive layer 120 is formed on the substrate 10 using a deposition method such as sputtering. The first conductive layer 120 is formed of a single layer with an alloy comprising Al and Ni. The first conductive layer 120 may further include a metal such as C, Nd, La, etc. Then, a photoresist is formed on the first conductive layer 120 and the photoresist is exposed using a first mask. Subsequently, a first photoresist pattern 290 is formed by developing the exposed photoresist using a tetramethyl ammonium hydroxide (TMAH) solution (2.38%). Next, the first conductive layer 120 is patterned along the first photoresist pattern 290 using the TMAH (2.38%) solution to form the first conductive pattern group including the gate line 21, the gate electrode 20 and the gate contact pad 25. The first conductive layer 120 can be etched at an etch rate of more than 100 nm/min for the TMAH (2.38%) solution.

Figure 4:
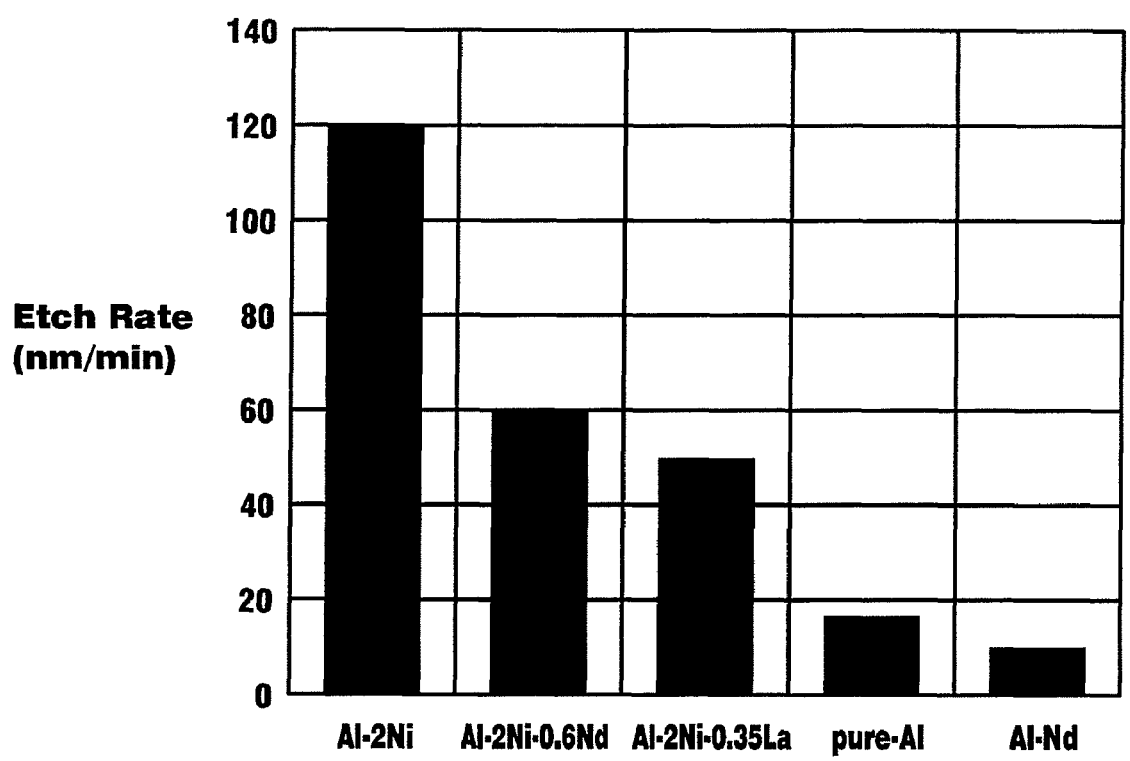
FIG. 4 is a graph showing etch rates of metals for a TMAH (2.38%) solution.

FIG. 4 is a graph showing etch rates of respective metals for the TMAH (2.38%) solution. Referring to FIG. 4, the etch rates of AlNi, Al and AlNd, AlNiNd, and AlNiLa are 120 nm/min, less than 20 nm/min, 60 nm/min and 50 nm/min, respectively. According to an embodiment, the first conductive layer 120 uses AlNi having an etch rate of 120 nm/min for the TMAH (2.38%) solution. It is possible to form the first conductive layer 120 by changing the contents of Nd and La since the etch rates of AlNiNd and AlNiLa are varied in accordance with the contents of Nd and La. The first conductive layer 120 may further comprise at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Mo, Hf, Ta, W and Dy in addition to Nd and La. Moreover, the first conductive layer 120 may comprise an Al-based alloy containing 0.1 to 6 atm % of Ni and a total of 0.1 to 2 atm % of at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Nb, Mo, Hf, Ta, W and Dy.

Figure 7:
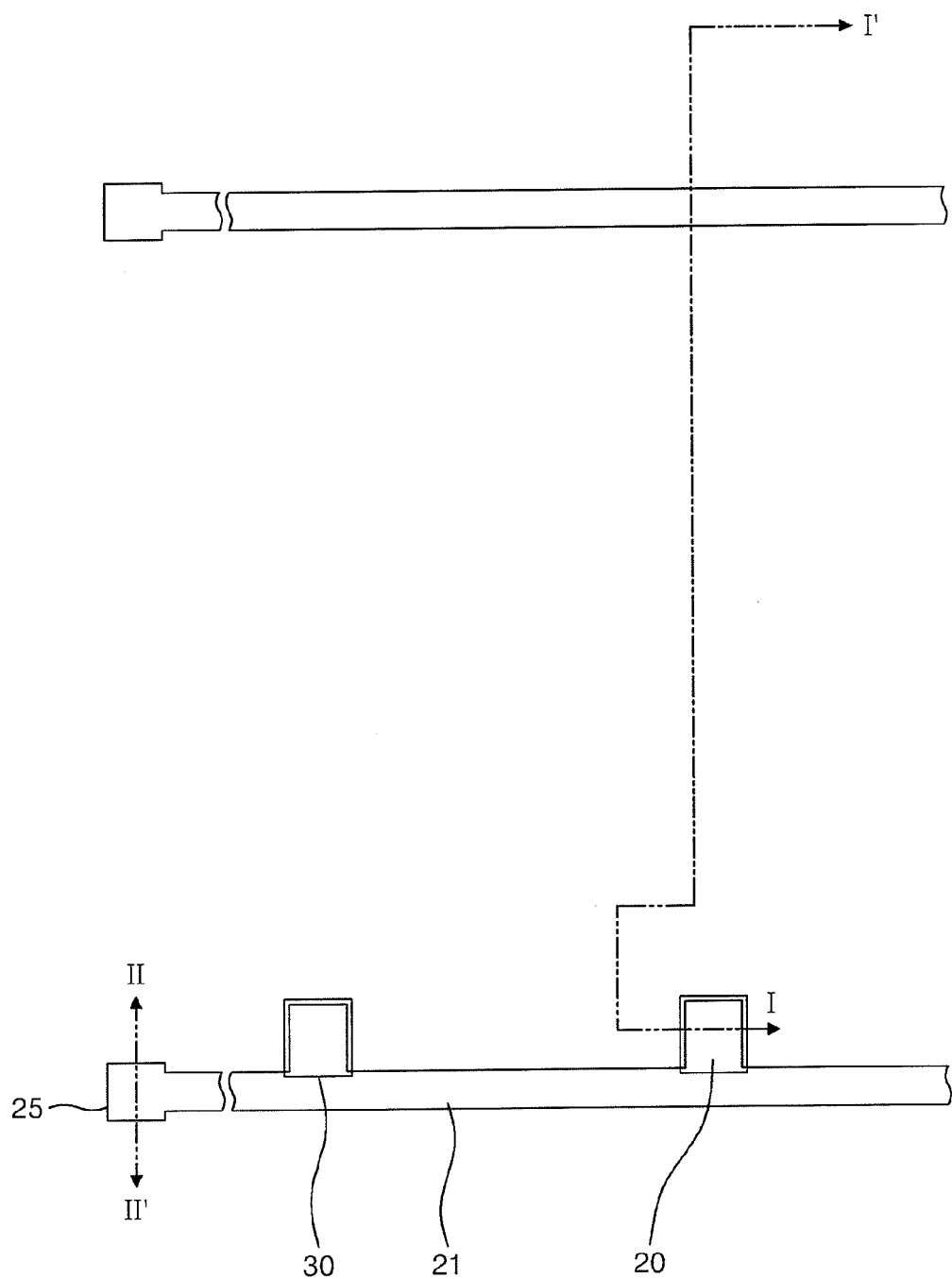
FIG. 7 is a plan view showing a second mask process in a method of manufacturing a TFT substrate according to an exemplary embodiment of the present invention.

FIG. 7 is a plan view showing a second mask process in the method of manufacturing the TFT substrate according to an exemplary embodiment of the present invention, and FIGS. 8A and 8B show cross-sectional views taken along lines I-I' and II-II' of the TFT substrate in FIG. 7.

Referring to FIGS. 7, 8A and 8B, the gate insulating layer 30, the semiconductor layer 40 and the ohmic contact layer 50 are formed on the substrate 10, on which the first conductive pattern group has been formed, through the second mask process.

In more detail, the gate insulating layer 30, a-Si and n+ a-Si are sequentially stacked on the substrate 10, on which the gate line 21, the gate electrode 20 and gate contact pad 25 have been formed, using a deposition method such as plasma enhanced chemical vapor deposition ("PECVD"), chemical vapor deposition ("CVD"), and the like. Subsequently, the a-Si and n+ a-Si are patterned in photolithography and etching processes using a second mask to form the semiconductor layer 40 and the ohmic contact layer 50. As the gate insulating layer 30, an inorganic insulating material such as SiNx, SiOx, etc. may be used.

It is possible to further form a nitride film through a nitride process after the formation of the ohmic contact layer 50. The nitride film may be formed by supplying $N_2$ in a chamber and then heating the chamber at 370° C. or less for more than 30 seconds.

Figure 9:
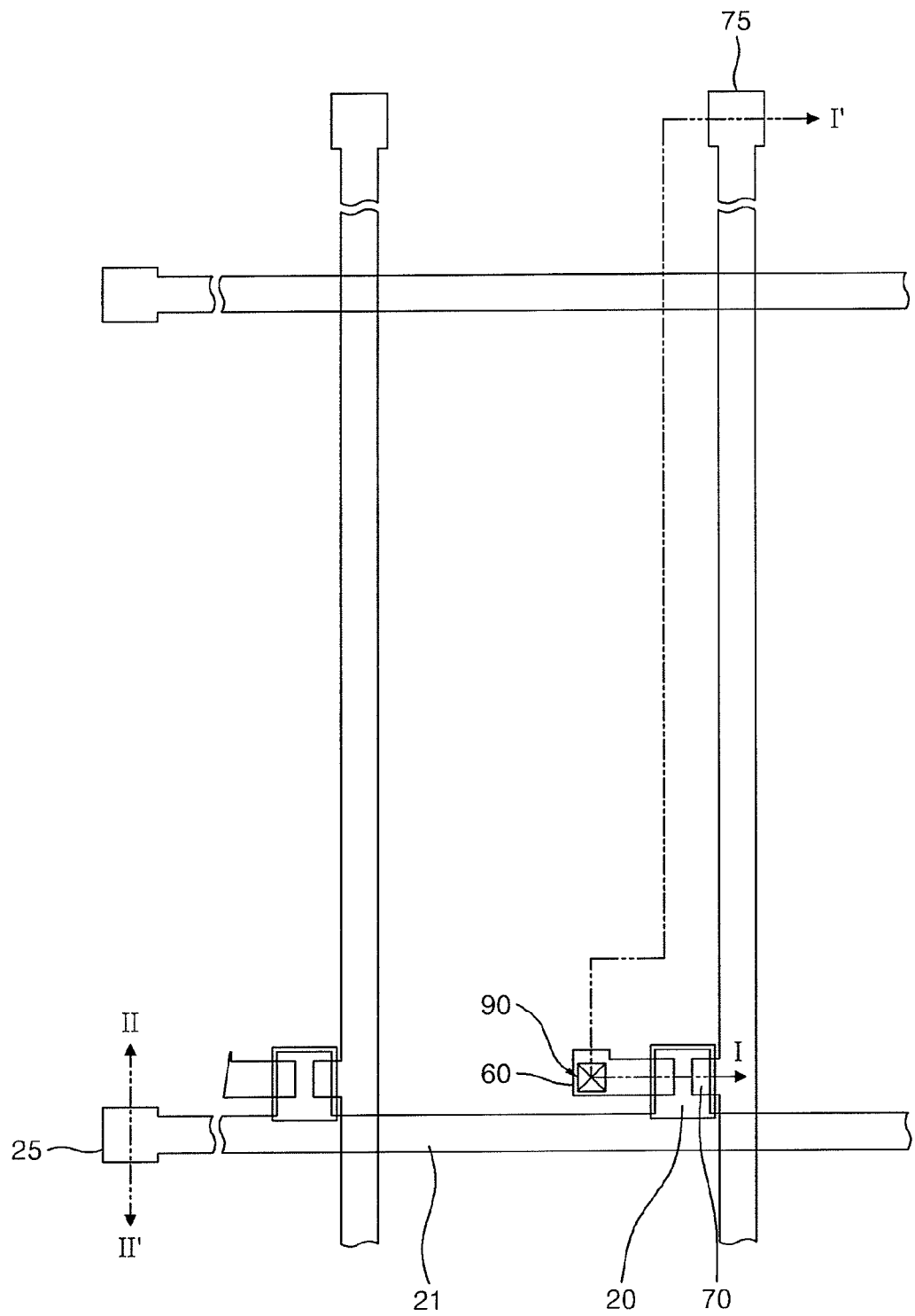
FIG. 9 is a plan view showing a third mask process in a method of manufacturing a TFT substrate according to the exemplary embodiment of the present invention.

FIG. 9 is a plan view showing a third mask process in the method of manufacturing a TFT substrate according to an exemplary embodiment of the present invention, and FIGS. 10A and 10C and 10B and 10D show cross-sectional views taken along lines I-I' and II-II', respectively, of the TFT substrate in FIG. 9.

Referring to FIGS. 9, 10A, 10B, 10C and 10D, a second conductive pattern group including data lines 71a and 71b, drain electrodes 60a and 60b, and data contact pads 75a and 75b are formed on the gate insulating layer 30, on which the semiconductor layer 40 and the ohmic contact layer 50 have been formed, through the third mask process.

In more detail, the data lines 71a and 71b are formed on the gate insulating layer 30 to intersect the gate line 21, and the drain electrodes 60a and 60b are formed on the gate insulating layer 30 on which the drain electrodes 60a and 60b and the semiconductor layer 40 have been formed. At this time, the source electrodes 70a and 70b are connected to the data lines 71a and 71b and formed on the gate insulating layer 30, on which the semiconductor layer 40 and the ohmic contact layer 50 have been formed, to face the drain electrodes 60a and 60b. As shown in FIGS. 10A and 10B, the second conductive pattern group is formed by forming the second and third conductive layers 130 and 140 using a deposition method such as sputtering and then by patterning the second and third conductive layers 130 and 140 in a photolithography process through the third mask process.

The second conductive layer 130 may include $N_2$ added to AlNi as a nitridation process. In more detail, when AlNi is deposited on the ohmic contact layer 50 and the gate insulating layer 30 using a deposition method such as sputtering, Ar and $N_2$ gases are supplied into the chamber. At this time, the Ar and $N_2$ gases are mixed with each other in a ratio of from 1:0.25 to 1:4. If the ratio of the Ar and $N_2$ gases is less than 1:0.25 as the Ar gas is increased, residuals may be generated after the second conductive layer 130 is etched in the subsequent process. Accordingly, the ratio of the Ar and $N_2$ gases may be from 1:0.25 to 1:4. It is possible to use $NH_3$ instead of $N_2$. The second conductive layer 130 may be formed with a thickness of less than about 1000 Å. The second conductive layer 130 may further include at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Nb, Mo, Hf, Ta, W and Dy during the deposition of AlNi using a deposition method such as sputtering. Moreover, the second conductive layer 130 may comprise an Al-based alloy containing 0.1 to 6 atm % of Ni and a total of 0.1 to 2 atm % of at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Nb, Mo, Hf, Ta, W and Dy.

A third conductive layer 140 including AlNi is formed on the second conductive layer 130 using a deposition method such as sputtering. The third conductive layer 140 may be formed with a thickness of less than about 4500 Å. Here, the third conductive layer 140 may further include at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Mo, Hf, Ta, W and Dy. That is, the third conductive layer 140 may comprise an Al-based alloy containing 0.1 to 6 atm % of Ni and a total of 0.1 to 2 atm % of at least one of Mg, Cr, Mn, Ru, Rh, Pd, Ir, Pt, La, Ce, Pr, Gd, Tb, Sm, Eu, Ho, Er, Tm, Yb, Lu, Ti, V, Zr, Nb, Mo, Hf, Ta, W and Dy.

Next, as shown in FIGS. 10C and 10D, a photoresist is formed on the second and third conductive layers 130 and 140 and the photoresist is exposed using a third mask. Subsequently, a second photoresist pattern 300 is formed by developing the exposed photoresist using the TMAH (2.38%) solution. Then, the second and third conductive layers 130 and 140 are patterned along the second photoresist pattern 300 using the TMAH (2.38%) solution to form the second conductive patterns including the data lines 71a and 71, the source electrodes 70a and 70b and the data contact pads 75a and 75b. The second and third conductive layers 130 and 140 may be etched at an etch rate of more than 100 nm/min in order to reduce the manufacturing time. As shown in FIG. 4, it can be understood that the etch rates of the first and second conductive layers 130 and 140 are higher than those of other metals since the first and second conductive layers 130 and 140 have an etch rate of 120 nm/min for the TMAH (2.38%) solution.

Figure 11:
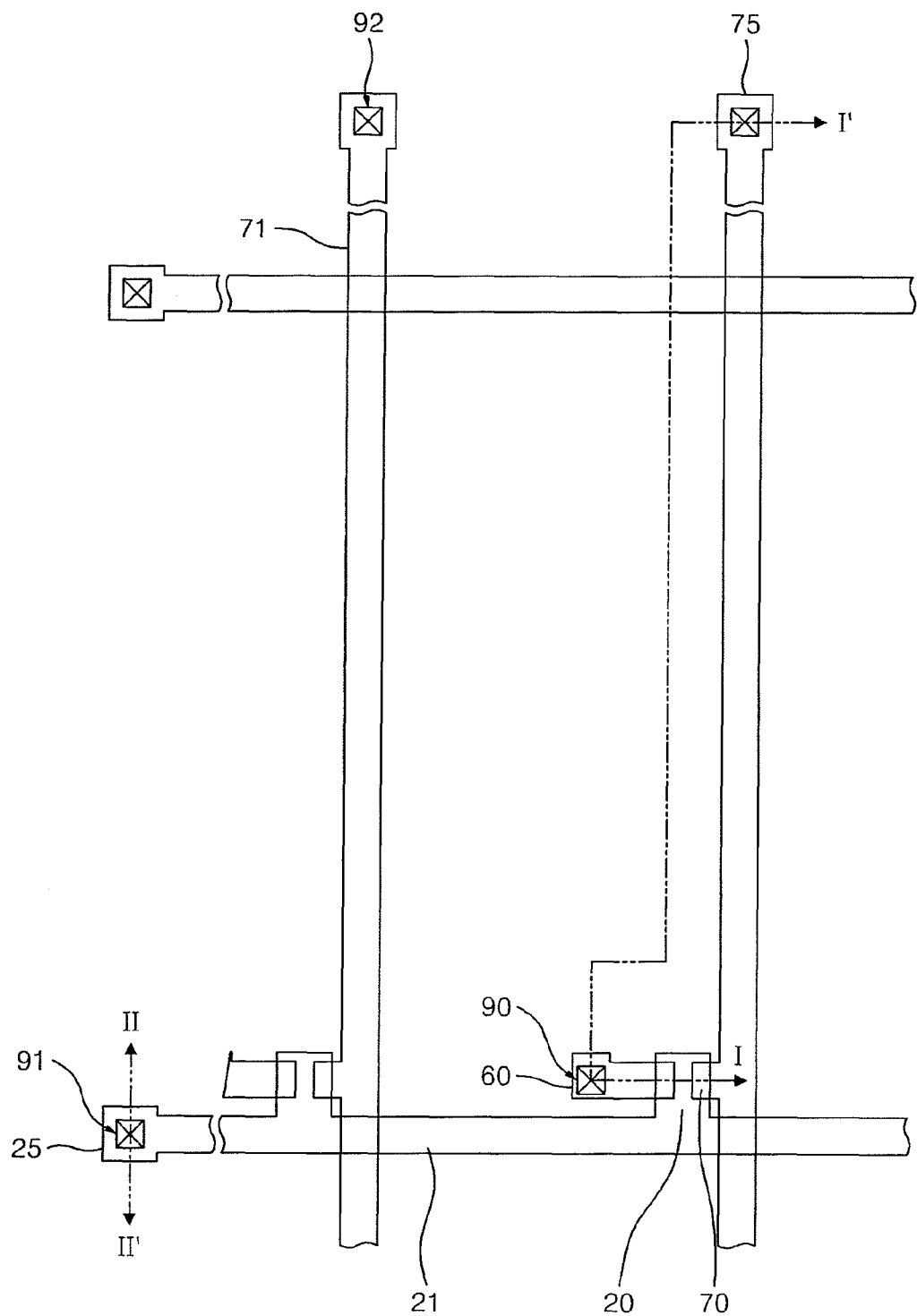
FIG. 11 is a plan view showing a fourth mask process in a method of manufacturing the TFT substrate according to an exemplary embodiment of the present invention.

FIG. 11 is a plan view showing a fourth mask process in a method of manufacturing a TFT substrate according to the exemplary embodiment of the present invention, and FIGS. 12A and 12B show cross-sectional views taken along lines I-I' and II-II' of the TFT substrate in FIG. 11.

Referring to FIGS. 11, 12A and 12B, the protection layer 80 including the pixel contact hole 90, and the first and second contact holes 91 and 92 is formed on gate insulating layer 30, on which the second conductive pattern group has been formed, through the fourth mask process.

In more detail, the protection layer 80 is formed on the substrate 10, on which the second conductive pattern group has been formed, using a deposition method such as PECVD, CVD, spin coating, and the like. The pixel contact hole 90 exposing the drain electrode 60, the first contact hole 91 exposing the gate line 21, and the second contact hole 92 exposing the data line 71 are formed by penetrating the protection layer 80 in photolithography and etching processes using a fourth mask.

The protection layer 80 may be formed of an inorganic insulating material such as SiNx, SiOx, etc., an organic insulating material, or in a double layer structure including the organic and inorganic materials. If the organic insulating material is used to form the protection layer 80, the inorganic material is formed on the overall substrate 10 prior to the formation of the organic material in order to prevent the deterioration of the TFT 200.

Figure 13:
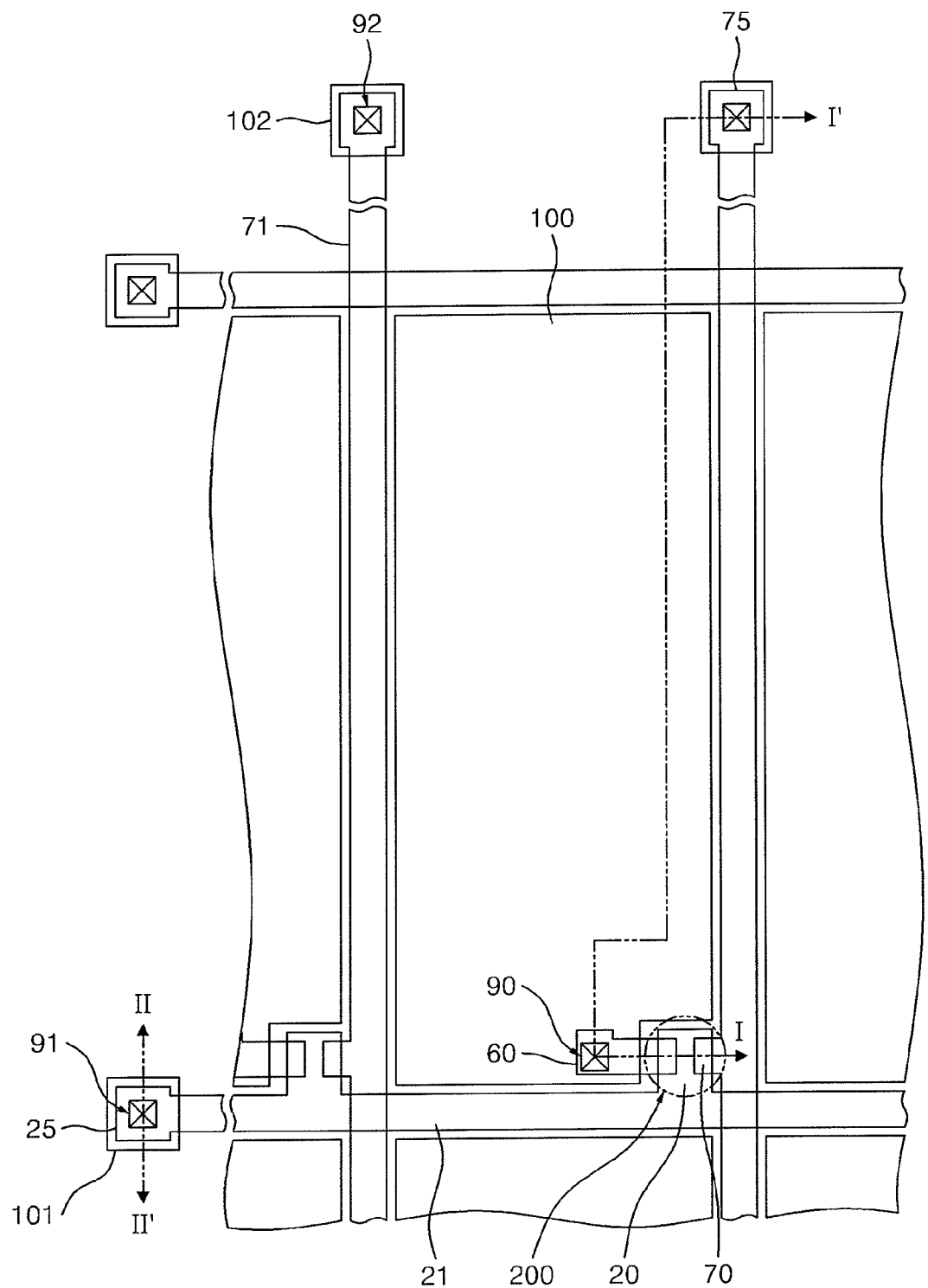
FIG. 13 is a plan view showing a fifth mask process in a method of manufacturing a TFT substrate according to an exemplary embodiment of the present invention.
Figure 14A:
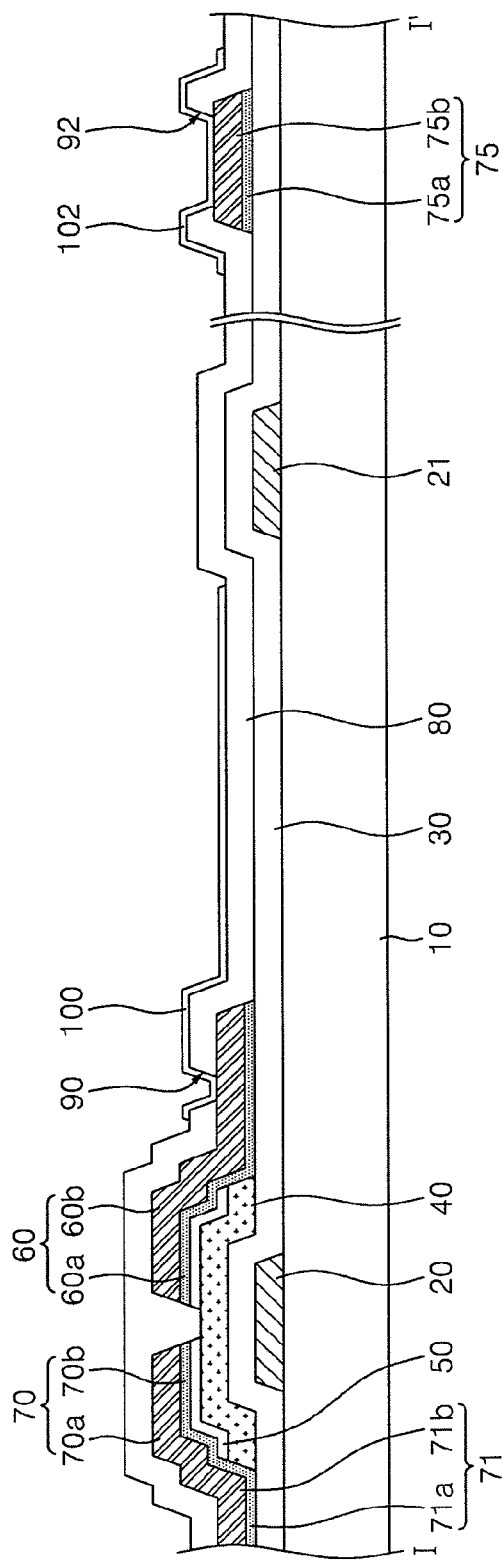
FIGS. 14A and 14B are cross-sectional views taken along lines I-I' and II-II' of the TFT substrate in FIG. 13.
Figure 14B:
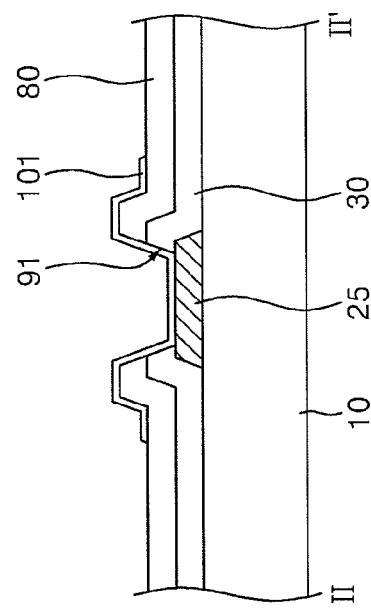

FIG. 13 is a plan view showing a fifth mask process in a method of manufacturing a TFT substrate according to the exemplary embodiment of the present invention, and FIGS. 14A and 14B show cross-sectional views taken along lines I-I' and II-II' of the TFT substrate in FIG. 13.

Referring to FIGS. 13, 14A and 14B, a third conductive pattern group including the pixel electrode 100 and the first and second pad electrodes 101 and 102 is formed on the protection layer 80 through the fifth mask process.

In more detail, after the pixel electrode 100 is formed of a transparent conductive layer on the protection layer 80, the transparent conductive layer is patterned in photolithography and etching processes using a fifth mask. As the transparent conductive layer, a transparent conductive material such as indium tin oxide (ITO), indium zinc oxide (IZO), tin oxide (TO), etc. may be used. The pixel electrode 100 is connected to the drain electrode 60 through the pixel contact hole 90, the first pad electrode 101 is connected to the gate contact pad 25 through the first contact hole 91, and the second pad electrode 102 is connected to the data contact pad 75 through the second contact hole 92.

As described above, the TFTs, the TFT substrate including the TFTs and the method of manufacturing the same, in accordance with embodiments of the present invention, can be applied to an LCD device and an OLED substrate in the same or similar manner.

According to embodiments of the present invention, it is possible to form the first conductive pattern group including the gate contact pad with an alloy containing AlNi, thus reducing the contact resistance between the first conductive pattern group and the contact electrode formed of a metallic material such as ITO, IZO, etc, and further forming the first conductive pattern in a single layer.

Moreover, it is possible to form the second conductive pattern group including the data line, the source electrode, the drain electrode and the data contact pad with an alloy containing AlNi, thus reducing the contact resistance between the second conductive pattern group and the contact electrode and the pixel electrode formed of a metallic material such as ITO, IZO, etc. The source electrode and the drain electrode can prevent the Al component from being diffused into the ohmic contact layer since a nitride AlNi is formed on the ohmic contact layer.

Furthermore, since an AlNi alloy is used to form the first and second conductive pattern groups, the TMAH (2.38%) solution is used as a photoresist developer. Accordingly, it is possible to omit the separate processes of etching the first and second conductive pattern groups using etchants, respectively, thus reducing the manufacturing time and cost.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A method of manufacturing a thin film transistor (TFT) substrate, comprising:
   forming a first conductive pattern group including a gate line and a gate electrode on a substrate as a first conductive layer;
   forming a gate insulating layer on the first conductive pattern group;
   forming a semiconductor layer and an ohmic contact layer on the gate insulating layer;
   forming a second conductive pattern group including a source electrode, a drain electrode and a data line, wherein the source and drain electrodes are formed of a second conductive layer, which is formed on the ohmic contact layer and contains aluminum nitride and nickel nitride, and of a third conductive layer, which is formed on the second conductive layer and contains aluminum and nickel, and wherein the data line is connected to the source electrode, intersects the gate line and is insulated by the gate insulating layer;
   forming a protection layer on the gate insulating layer on which the second conductive pattern group has been formed, wherein the protection layer includes a pixel contact hole exposing the drain electrode; and
   forming a third conductive pattern group on the protection layer, wherein the third conductive pattern group includes a pixel electrode connected to the drain electrode through the pixel contact hole.

2. The method of claim 1, wherein forming the second conductive pattern group comprises:
   forming the second conductive layer;
   forming the third conductive layer on the second conductive layer;
   forming a photoresist on the third conductive layer;
   exposing the photoresist;
   forming a second photoresist pattern by developing the exposed photoresist using a TMAH solution; and
   patterning the second and third conductive layers in the form of the second photoresist pattern through an etching process using the TMAH solution.

3. The method of claim 2, wherein forming the second conductive layer further comprises supplying argon gas and nitrogen gas in a chamber.

4. The method of claim 3, wherein the argon and nitrogen gases are mixed with each other in a ratio of from 1:0.25 to 1:4.

5. The method of claim 4, wherein forming the second and third conductive layers comprises:
   forming the second conductive layer with a thickness of less than about 1000 Å; and
   forming the third conductive layer with a thickness of less than about 4500 Å.

6. The method of claim 1, wherein forming the first conductive pattern group comprises:
   forming the first conductive layer on the substrate;
   disposing a photoresist on the first conductive layer;
   exposing the photoresist;
   forming a first photoresist pattern by developing the exposed photoresist with the TMAH solution; and
   patterning the first conductive layer in the form of the first photoresist pattern through an etching process using the TMAH solution.

7. The method of claim 6, further comprising:
   forming a gate contact pad formed of the first conductive layer and connected to the gate line;
   forming a data contact pad formed of the second and third conductive layers and connected to the data line;
   forming a first contact hole exposing the gate contact pad;
   forming a second contact hole exposing the data contact pad;
   forming a first pad electrode connected to the gate contact pad through the first contact hole; and
   forming a second pad electrode connected to the data contact pad through the second contact hole.

8. The method of claim 7, wherein the forming the first, second and third conductive layers further comprises etching the first, second and third conductive layers at an etch rate of more than 100 nm/min for the TMAH solution.

* * * * *